United States Patent
Paulsen et al.

(10) Patent No.: US 10,367,520 B1
(45) Date of Patent: Jul. 30, 2019

(54) CHARGE-SCALING SUBTRACTOR CIRCUIT

(71) Applicant: International Business Machines Corporation, Armonk, NY (US)

(72) Inventors: David Paulsen, Inver Grove Heights, MN (US); Phil Paone, Rochester, MN (US); John E. Sheets, II, Zumbrota, MN (US); George Paulik, Rochester, MN (US); Karl Erickson, Rochester, MN (US); Gregory J. Uhlmann, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/018,113

(22) Filed: Jun. 26, 2018

(51) Int. Cl.
  *H03M 1/34* (2006.01)
  *H03M 1/16* (2006.01)
  (Continued)

(52) U.S. Cl.
  CPC .......... *H03M 1/16* (2013.01); *H03M 1/1245* (2013.01); *H03M 1/361* (2013.01)

(58) Field of Classification Search
  CPC ...... H03M 1/16; H03M 1/1245; H03M 1/361; H03M 1/00; H03M 7/00
  (Continued)

(56) References Cited

U.S. PATENT DOCUMENTS

| 6,967,611 B2 | 11/2005 | Atriss et al. |
| 7,102,557 B1 | 9/2006 | Frith |

(Continued)

FOREIGN PATENT DOCUMENTS

| CN | 107247190 A | 10/2017 |
| JP | 5802001 B2 | 10/2015 |
| WO | 2014072391 A1 | 5/2014 |

OTHER PUBLICATIONS

Alaghi et al., "The Promise and Challenge of Stochastic Computing", IEEE Transactions on Computer-Aided Design of Integrated Circuits and Systems, (c) 2017 IEEE, 19 pages.

(Continued)

*Primary Examiner* — Jean B Jeanglaude
(74) *Attorney, Agent, or Firm* — Nathan M. Rau

(57) ABSTRACT

A subtractor circuit can be fabricated within an integrated circuit (IC) and can be configured to draw a difference output node to a voltage proportional to a difference between two received N-bit binary numbers. The subtractor circuit includes sets of N inputs that receive N-bit binary numbers, each set of N inputs indexed by an integer bit number "n." The subtractor circuit includes two sets of scaled capacitors, each capacitor of one set connected to an $n^{th}$ input of the corresponding set of N inputs and to the difference output node. Each scaled capacitor has a capacitance equal to $2^{(n)}*a$ unit capacitance ($C_{UNIT}$). The subtractor circuit includes a reference capacitor connected to ground and the difference output node, and a reset circuit configured to draw, in response to a received RESET signal, the difference output node to ground.

20 Claims, 6 Drawing Sheets

(51) Int. Cl.
  *H03M 1/36* (2006.01)
  *H03M 1/12* (2006.01)
(58) Field of Classification Search
  USPC ................................. 341/158, 155, 50, 51
  See application file for complete search history.

(56) References Cited

U.S. PATENT DOCUMENTS

| | | | |
|---|---|---|---|
| 7,268,718 | B1 | 9/2007 | Wu |
| 7,280,058 | B1 | 10/2007 | Zhu et al. |
| 7,336,126 | B2 | 2/2008 | Donig |
| 7,460,046 | B2 | 12/2008 | Di Giandomenico et al. |
| 7,786,917 | B2 | 8/2010 | Hu et al. |
| 7,936,299 | B2 | 5/2011 | Astley et al. |
| 8,823,572 | B2 * | 9/2014 | Lemkin ............... H03M 1/1245 341/155 |
| 9,054,733 | B2 | 6/2015 | Quiquempoix et al. |
| 9,071,265 | B1 * | 6/2015 | Dey ................... H03M 1/0695 |
| 9,214,912 | B2 | 12/2015 | Lee |
| 9,297,911 | B2 | 3/2016 | Rostaing et al. |
| 9,312,831 | B2 | 4/2016 | Nestler et al. |
| 9,602,119 | B1 | 3/2017 | Maulik et al. |
| 9,609,259 | B1 | 3/2017 | Tiew |
| 9,904,512 | B1 | 2/2018 | Pasca |
| 2001/0000661 | A1 * | 5/2001 | Miyamoto ............ G06F 7/5013 341/56 |
| 2009/0201051 | A1 * | 8/2009 | Ono .................... G11C 27/026 327/96 |
| 2014/0247177 | A1 * | 9/2014 | Draxelmayr ........ H03M 1/0692 341/156 |

OTHER PUBLICATIONS

Minaei et al., "Memstor, memstance simulations via a versatile 4-port built with new adder and subtractor circuits", International Journal of Electronics, vol. 102, 2015—Issue 6, Abstract Only, 5 pages.
Paone et al., "Negative Operand Compatible Charge-Scaling Subtractor Circuit", U.S. Appl. No. 16/202,310, filed Nov. 28, 2018.
IBM, List of IBM Patents or Patent Applications Treated as Related, Nov. 28, 2018, 2 pages.
Anonymous, "One Step Carry Adder", An IP.com Prior Art Database Technical Disclosure, IP.com No. IPCOM000008303D, IP.com Electronic Publication Date: Jun. 4, 2002, 5 pages.
IBM "Method of Data Addition in Bit-Position-Coding Data Format", An IP.com Prior Art Database Technical Disclosure, IP.com No. IPCOM000182330D, IP.com Electronic Publication Date: Apr. 27, 2009, 13 pages.
Anonymous, "A Device and Method for Eliminating Redundant Hardware by Utilizing a Vectorized Fixed Point Multiplier", An IP.com Prior Art Database Technical Disclosure, IP.com No. IPCOM000239274D, IP.com Electronic Publication Date: Oct. 24, 2014, 7 pages.
Unknown, "EE247—Lecture 14", Data Converters—DAC Design, 34 pages, Copyright 2009 https://inst.eecs.berkeley.edu/%7Eee247/fa09/files07/lectures/L14_2_f09.pdf.
Thakur et al., "Low-Power Architectures and Self-Calibration Techniques of DAC for SAR-ADC implementation", International Journal of Innovative Research in Electrical, Electronics, Instrumentation and Control Engineering, vol. 2, Issue 3, Mar. 2014, 4 pages.
Paulsen et al., "Charge-Scaling Adder Circuit", U.S. Appl. No. 16/018,108, filed Jun. 26, 2018.
IBM, List of IBM Patents or Patent Applications Treated as Related, Jun. 21, 2018, 2 pages.

* cited by examiner

CHARGE-SCALING SUBTRACTOR CIRCUIT

BACKGROUND

The present disclosure generally relates to integrated circuits (ICs). In particular, this disclosure relates to a charge-scaling subtractor circuit used to perform rapid subtraction operations on binary numbers within an IC.

An IC, also known as a "microchip," silicon or computer "chip," is a specially prepared piece of silicon, or other semiconductor material, into which a complex electronic circuit is etched and formed using a photolithographic process. IC types can include computer processors, memory, analog, and customizable devices. ICs can be relatively fragile, and therefore are often mounted on and/or surrounded by a protective, supportive ceramic or plastic package. Electrical connections to the chip can be provided through metal contacts, which can include pins or solder balls located on the exterior of the chip package.

ICs can have certain advantages over comparable discrete circuits, such as relatively low-cost and high-performance. The cost of an IC can be relatively low, resulting from the large number, e.g., millions, of transistors that can be simultaneously printed as a complete functional unit by photolithographic techniques, rather than constructing an equivalent circuit from individually fabricated transistors. Performance of an IC can be significantly higher than an equivalent discrete circuit, due to the high density and relatively low electrical interconnect parasitics between active devices such as transistors. Types of ICs may include analog, digital and "mixed signal" chips, i.e., chips that incorporate both analog and digital functions on the same silicon die.

A capacitor is a passive electrical component having at least two electrical conductors known as plates, separated by a dielectric or insulator, and which may be used to electrostatically store energy in an electric field. Capacitors may be useful as circuit elements in conjunction with a variety of types of electronic devices such as digital and analog ICs.

SUMMARY

Embodiments may be directed towards a subtractor circuit fabricated within an integrated circuit (IC). The subtractor circuit can be configured to draw, using charge-scaling circuitry, a difference output node to a voltage proportional to a difference between two received N-bit binary numbers. The subtractor circuit can include a first set of N inputs configured to receive a first binary number having N bits, each input of the first set of N inputs indexed by an integer bit number "n" that corresponds to each input's respective significance, where n is in a range between and including 0 and N−1. The subtractor circuit can also include a first set of scaled capacitors, each capacitor of the first set of scaled capacitors having an input terminal electrically connected to a corresponding nth input of the first set of N inputs and an output terminal electrically connected to the difference output node. Each capacitor can further have a capacitance value equal to $2^{(n)}*$a unit capacitance value ($C_{UNIT}$). The subtractor circuit can also include a second set of N inputs configured to receive a second binary number having N bits, each input of the second set of N inputs indexed by the integer bit number "n" that corresponds to each input's respective significance. The subtractor circuit can also include a set of inverters, each inverter of the set of inverters having an input terminal electrically connected to a corresponding $n^{th}$ input of the second set of N inputs. Each inverter of the set of inverters can further have an output terminal electrically connected to an input terminal of a corresponding nth capacitor of a second set of scaled capacitors. The subtractor circuit can also include a second set of scaled capacitors, each capacitor of the second set of scaled capacitors having an output terminal electrically connected to the difference output node, each capacitor further having a capacitance value equal to $2^{(n)}*C_{UNIT}$. The subtractor circuit can also include a reference capacitor electrically connected to ground and electrically connected to the difference output node. A capacitance of the reference capacitor can equal a sum of the values of each of the least significant (LS) scaled capacitors of the first and second sets of scaled capacitors. The subtractor circuit can also include a reset device electrically connected to ground and electrically connected to the difference output node through an output terminal. The reset device can be configured to draw, in response to receiving a reset signal at an input terminal, the difference output node to ground.

Embodiments may also be directed towards a subtractor circuit fabricated within an integrated circuit (IC). The subtractor circuit can be configured to draw a difference output node to a voltage proportional to a difference between two received N-bit binary numbers. The subtractor circuit can include a plurality of sections including a most significant (MS) section. Each section of the plurality of sections can have a respective local difference node and a local reset device configured to draw, in response to receiving a reset signal, the respective local difference node to ground, the local difference node of the MS section being the difference output node. The subtractor circuit can also include a plurality of attenuation capacitors having first and second terminals electrically interconnected to respective local difference nodes of electrically adjacent sections of the plurality of sections. The subtractor circuit can also include a first set of N inputs configured to receive a first binary number having N bits, each input of the first set of N inputs indexed by an integer bit number "n" that corresponds to each input's respective significance, where n is in a range between and including 0 and N−1. The subtractor circuit can also include a first set of scaled capacitors including at least one capacitor located within each section of the plurality of sections, the first set of scaled capacitors further including a first MS capacitor located within the MS section. The first MS capacitor can have an input terminal electrically connected to an MS input of the first set of N inputs, each capacitor of the first set of scaled capacitors having an input terminal electrically connected to a corresponding nth input of the first set of N inputs, an output terminal electrically connected to a respective local difference node, and a capacitance value equal to $2^{(n)}*$a unit capacitance value ($C_{UNIT}$). The subtractor circuit can also include a second set of N inputs configured to receive a second binary number having N bits, each input of the second set of N inputs indexed by the integer bit number "n" that corresponds to each input's respective significance. The subtractor circuit can also include a set of inverters, each inverter of the set of inverters having an input terminal electrically connected to a corresponding nth input of the second set of N inputs, each inverter of the set of inverters further having an output terminal electrically connected to an input terminal of a corresponding nth capacitor of a second set of scaled capacitors. The second set of scaled capacitors can include at least one capacitor located within each section of the plurality of sections, the second set of scaled capacitors further including a second MS capacitor located within the MS section. The second MS capacitor can have an input terminal electrically connected to an output terminal of an MS inverter of the set of inverters. Each capacitor of the second set of scaled capacitors can have an input terminal electrically connected to a corresponding output terminal of the nth inverter of the set of inverters, an output terminal electrically connected to a respective local difference node, and a capacitance value equal to $2^{(n)} * C_{UNIT}$. The subtractor circuit can also include a reference capacitor electrically connected to ground, and further electrically connected to a local difference node of a least significant (LS) section of the plurality of sections, a reference capacitor value equal to a sum of the values of each of the LS scaled capacitors of the first and second sets of scaled capacitors.

Embodiments may also be directed towards a method of operating a subtractor circuit that uses charge-scaling to subtract, from a first N-bit binary number, a second N-bit binary number. The subtractor circuit can be fabricated within an IC. The method can include resetting the subtractor circuit by drawing to ground, with a reset device of the subtractor circuit, a difference output node of the subtractor circuit and receiving, with a first set of N inputs of the subtractor circuit, a first N-bit binary number. The method can also include receiving, with a second set of N inputs of the subtractor circuit, a second N-bit binary number. The method can also include inverting, with a set of inverters of the subtractor circuit, the second N-bit binary number received from the second set of N inputs and driving, onto a set of inverter outputs, the value of the inverted second N-bit binary number. The method can also include drawing, with first and second sets of scaled capacitors of the subtractor circuit electrically connected to the first set of N inputs and to the set of inverter outputs, respectively, a difference output node of the subtractor circuit to a voltage proportional to a difference between the first and second N-bit binary numbers. The above summary is not intended to describe each illustrated embodiment or every implementation of the present disclosure.

BRIEF DESCRIPTION OF THE DRAWINGS

The drawings included in the present application are incorporated into, and form part of, the specification. They illustrate embodiments of the present disclosure and, along with the description, serve to explain the principles of the disclosure. The drawings are only illustrative of certain embodiments and do not limit the disclosure.

Figure 1:
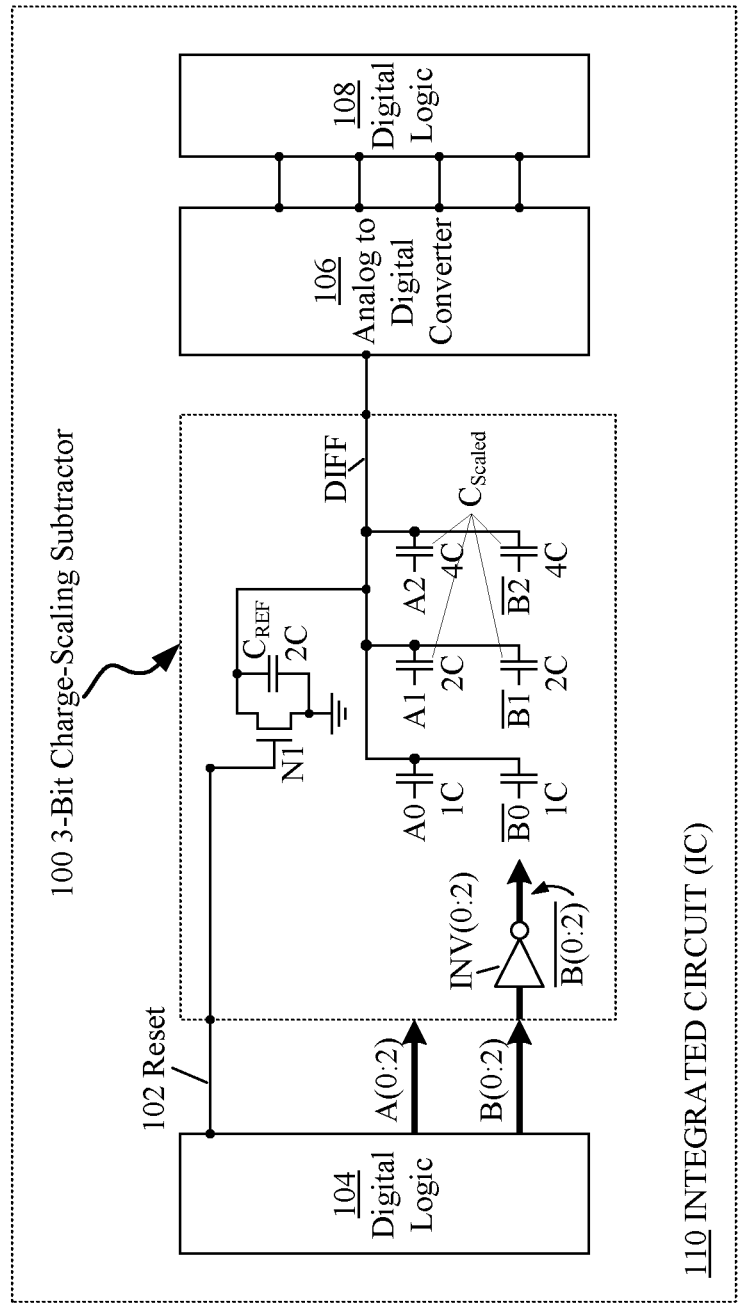
FIG. 1 includes a schematic depiction of a 3-bit charge-scaling subtractor circuit within an integrated circuit (IC), according to embodiments of the present disclosure.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention.

In the drawings and the Detailed Description, like numbers generally refer to like components, parts, steps, and processes.

DETAILED DESCRIPTION

Certain embodiments of the present disclosure can be appreciated in the context of providing, through the use of a charge-scaling subtractor circuit, rapid subtraction of binary numbers, for electronic equipment such as processor integrated circuits (ICs). Such processor ICs may be used to provide computational capabilities to electronic equipment such as servers. Such servers may include, but are not limited to web servers, application servers, mail servers, and virtual servers. While not necessarily limited thereto, embodiments discussed in this context can facilitate an understanding of various aspects of the disclosure. Certain embodiments may also be directed towards other equipment and associated applications, such as providing rapid subtraction of binary numbers for ICs used in electronic equipment such as computing systems, which may be used in a wide variety of computational and data processing applications. Such computing systems may include, but are not limited to, supercomputers, high-performance computing (HPC) systems, and other types of special-purpose computers. Embodiments may also be directed towards providing rapid subtraction of binary numbers for ICs used in consumer and small office/home office (SOHO) electronic equipment such as personal computers, laptops, mobile and network server devices.

Individual bits of multi-bit binary numbers, corresponding input and output signal names, circuit nodes, and associated scaled capacitors described herein can each be identified with a reference label including a signal name followed by a bit number. For example, a reference label "A0" denotes a signal name of "A" and a bit number of "0". The least-significant bit of a multi-bit binary number is referred to with a bit number of "0", e.g., "A0." Larger bit numbers are used to denote bits of higher significance in multi-bit binary numbers herein. Using, as an example, a three-bit binary number "A" that includes bits "0," "1" and "2," i.e., A0:A2, A0 is the least-significant, or lowest order, bit and A2 is the most-significant, or highest order, bit. For ease of discussion, in the case of a binary number having an arbitrary or unknown number of bits, the most significant bit of such a number may be referred to herein as the "$n^{th}$" bit.

For ease of discussion a single reference label, e.g., "A2", may be used in conjunction with multiple descriptors to identify various entities and elements depicted in the figures and discussed in the Specification. For example, terms such as "input A2," "bit A2" and "scaled capacitor A2" may each be understood to refer to various entities and items related to the A2 bit of a binary number input to a subtractor circuit.

Various aspects of the present disclosure may be useful for providing rapid subtraction capability and high-throughput computational capabilities to an IC and/or processor circuit for applications where limited numerical precision may be useful. Embodiments of the present disclosure can result in reductions in IC area and operating power required to implement subtractor circuits such as charge-scaling subtractors. Such embodiments may be implemented through the use of using existing and proven IC technologies, design tools, methodologies and fabrication techniques.

Certain classes of emerging and rapidly growing computer-based "data-centric" applications can both process, e.g., perform calculations on, and generate vast, unprecedented volumes of data in the course of pursuing a solution/answer to particular problems. Such classes of applications can, for example, start with a model and a set of initial conditions and can generate very large volumes of data on route to a solution, or can begin with vast datasets and seek succinct explanations for them.

"Data-centric" application classes can generally include, for example, machine learning (ML) and deep-learning problems/projects, artificial intelligence (AI) and logical inference applications, data mining, real-time high-throughput data analysis and neural networks. Particular application types within these classes can include genomics, nuclear physics simulations, seismology predictions, climate science and medical research. These classes and types of data-centric applications can be designed to make decisions and perform further sets of calculations based on the results of calculations performed on the vast amounts of data.

Existing hardware functions and corresponding software used to perform calculations on the vast amounts of data can include generally high-precision arithmetic operations and corresponding data formats, for example, 64-bit, double-precision or floating-point additions, subtractions and multiplications, as commonly used in scientific modeling applications. While such arithmetic operations can be used to process large amounts of data, the high degree of precision inherent in such operations is frequently not critical to subsequent tasks of making decisions based upon computational results, or performing further computations on the data. Decision-making and subsequent calculations for data-centric applications can frequently be successfully performed on data values having limited or lower precision than data produced by double-precision or floating-point operations, with no change or compromise to the end results of the computations.

Such limited-precision arithmetic operations can be performed by a variety of computing hardware systems, for example, a general-purpose computing system, a server, a supercomputer or high-performance computer (HPC) that is specially designed for a particular application. These systems can include, for example, ICs and software which can selectively employ a variety of types of binary arithmetic hardware functions and associated software integrated to access the hardware functions. Such a computing scheme can be known as a "mixed-precision" computing environment, due to the variety of numerical precisions which may be employed for particular computations. Mixed-precision computing environments can include, for example both high-precision, e.g., 64-bit, double-precision or floating-point subtraction operations alongside relatively low-precision operations such as 16-bit, or half-precision floating-point arithmetic and integer arithmetic operations. Such mixed-precision computing environments can produce higher computational efficiency and throughput when employed to host data-centric computing applications.

Certain other types of applications which process data at high throughput rates may not require high-precision calculations, and can thus benefit from the use of high-speed, limited-precision arithmetic functions. Such applications can include, for example, digital audio and video signal processing, where processing speed is of greater importance than absolute accuracy. For example, slight arithmetic inaccuracies in audio or video editing, rendering and playback functions may not be noticeable to an end-user of such applications. Other types of applications which may benefit from high-speed, limited-precision arithmetic operations can include real-time data processing applications such as inventory control or stock-trading applications, where the rate at which data can be processed takes precedence over the absolute accuracy of such data. In many such applications, access to and processing of real-time data may be substantially more important to subsequent decision-making than the absolute accuracy of such data.

Embodiments of the present disclosure can be useful for providing high-speed, limited precision numerical subtraction capability to an IC and/or processor circuit. Such an IC or processor circuit can be integrated into a wide variety of mixed-precision computational systems such as general-purpose computing systems, servers, supercomputers or HPCs. The integration of embodiments within such computational systems can result in significant acceleration of certain arithmetic operations when compared to existing implementation of these arithmetic operations on hardware employing only binary signal values and corresponding devices. Additionally, embodiments can provide for significantly reduced hardware power consumption and IC layout area required for arithmetic function implementation. Computational systems implemented with embodiments can experience significant increases in computational throughput capability, which can result in accelerated completion of computational tasks, and an ability to perform vast computational tasks which may have been previously impractical to perform.

Certain embodiments relate to providing, through the use of a charge-scaling subtractor circuit, rapid subtraction of binary numbers. FIG. 1 includes a schematic depiction of a 3-bit charge-scaling subtractor circuit 100, fabricated within an IC 110, according to embodiments of the present disclosure. In embodiments, IC 110 can also include digital logic 104, analog-to-digital converter 106 and digital logic 108, which can each be used in conjunction with the charge-scaling subtractor 100. In embodiments, the charge-scaling subtractor circuit 100 can be configured to provide rapid subtraction of received binary numbers for ICs such as central processing units (CPUs), graphics processing units (GPUs), application-specific integrated circuits (ASICs), and special-purpose ICs. A charge-scaling subtractor 100 as depicted in FIG. 1 can be fabricated with a wide variety of IC technologies and associated design methodologies, including, but not limited to, complementary metal-oxide semiconductor (CMOS), silicon on insulator (SOI), gallium arsenide (GaAs) and silicon-germanium (SiGe) IC technologies.

Within the configuration depicted in FIG. 1, 3-bit charge-scaling subtractor 100 can receive binary numbers A and B, and a RESET signal on reset input 102 from digital logic 104. Digital logic 104 can include, for example, a processor or processor core, a first-in, first-out (FIFO) memory device, a register or other circuit or function configured to supply binary numbers to the A and B inputs of 3-bit charge-scaling subtractor 100. According to embodiments, digital logic 104 can be configured to supply an interleaved sequence of binary numbers, i.e., A and B, and RESET signals to 3-bit charge-scaling subtractor 100.

In response to receiving input signals from digital logic 104, 3-bit charge-scaling subtractor 100 subsequently subtracts the binary number B from the binary number A, and provides an analog output signal representing the difference, i.e., A minus B at the DIFF output node. This output signal can then be received by analog-to-digital converter (ADC) 106, which is electrically connected to the subtractor 100's DIFF output. Once ADC 106 has converted the value of the received difference output signal to a binary number, the binary number can be received by digital logic 108. Digital logic 108 can include, for example, a processor or processor core, a FIFO memory device, register or other circuit or function configured to receive binary numbers from analog-to-digital converter 106.

ADC 106 can include converter types such as a flash analog-to-digital converter (ADC), a resistor ladder ADC, a parallel comparator ADC, a successive-approximation ADC and a counter-type ADC. An IC designer may select a particular type of ADC in order to meet particular design criteria such as conversion speed, power usage, IC area consumption or an analog voltage input range. For example, according to embodiments, the analog output signal at the DIFF output node of 3-bit charge-scaling subtractor 100 can be in a range between a negative supply voltage ($-V_{DD}$) and a positive supply voltage ($+V_{DD}$). Accordingly, an ADC 106 can be chosen by an IC or circuit designer that can receive analog signals in such an input voltage range.

FIG. 1 illustrates a charge-scaling subtractor 100 configured to receive two 3-bit binary numbers A and B and output a voltage that is an analog of the difference between these binary numbers, which when re-converted to binary by ADC 106, includes 4 bits. However, this is not to be construed as limiting. It can be understood that, according to embodiments, the binary numbers input to such a subtractor can include a different number of bits, e.g., 2, 4, 5, etc., and that the corresponding difference output can include a number of bits sufficient to represent the difference between the two binary input numbers.

According to embodiments, a subtractor such as 3-bit charge-scaling subtractor 100 can have significant performance, power consumption and IC area advantages over other types of subtractor circuits that employ only binary, i.e., logical "0" and "1," signal states to represent numbers. It is contemplated that, in comparison to traditional binary subtractor circuits, a charge-scaling subtractor can be used to subtract binary numbers approximately 5× faster, consume approximately 1% of the power, and require approximately 10% of the area of traditional binary subtractor circuits.

Charge-scaling subtractor 100 includes two sets of "N" inputs, i.e., A(0:2) and B(0:2), where N=3, that are configured to receive the 3-bit binary numbers A and B, respectively. Each input or bit belonging to both A an B is indexed by an integer bit number "n" corresponding to the bit's respective significance, where n is in a range between and including 0 and N−1, i.e., n=0, 1, 2. For example, A0 is the least significant bit, while A2 is the most significant bit.

3-bit charge-scaling subtractor 100 also includes scaled capacitors, $C_{SCALED}$. The inputs A and B are each associated with a corresponding set of the $C_{SCALED}$ capacitors, each capacitor of these corresponding sets having a scaled capacitance value that is equal to $2^{(n)}$*a unit capacitance value ($C_{UNIT}$). The set of scaled capacitors A0, A1 and A2, corresponding to the A input, each has one input terminal electrically connected to a respective $n^{th}$ A input and an output terminal electrically connected to the DIFF output node.

Each of the B inputs, i.e., B0, B1, and B2, is connected to an input terminal of a respective inverter from of a set of inverters INV(0:2). Each of the inverters INV(0:2) has an output terminal connected to an input terminal of a corresponding $n^{th}$ scaled capacitor, i.e., B0, B1 or B2. The inverters INV(0:2) drive the inverted copies of B0, B1 and B2, i.e., B0 NOT, B1 NOT and B2 NOT, to the input terminals of scaled capacitors B0, B1, and B2, respectively. In embodiments, driving the signals B0 NOT, B1 NOT and B2 NOT to the input terminals of scaled capacitors B0, B1, and B2, respectively, can be useful for providing a voltage excursion for asserted B NOT signals that is complimentary to the corresponding voltage excursion of asserted A inputs. This complimentary voltage excursion is useful, in conjunction with the capacitive voltage divider topology of the interconnected $C_{SCALED}$ and $C_{REF}$ capacitors, in providing a DIFF output voltage that represents the difference of the values of the two binary inputs, i.e., A minus B.

In embodiments, the unit capacitance $C_{UNIT}$ is equivalent to the capacitance value of the scaled capacitor connected to the least significant bit, i.e., A0 or B0 of the sets of "N" inputs A and B. For 3-bit charge-scaling subtractor 100, $C_{UNIT}$ is equal to C. In some embodiments, the unit capacitance $C_{UNIT}$ value can be specified to be in a range between 2× and 10× that of an input capacitance value of an ADC, e.g., ADC 106, that is connected to the DIFF output node of the charge-scaling subtractor, e.g., 100. By way of example, the unit capacitance $C_{UNIT}$ can be approximately 1 fF, for example, for a 14 nm CMOS or SOI technology. Other unit capacitance $C_{UNIT}$ values may be used for other IC technologies.

According to embodiments, 3-bit charge-scaling subtractor 100 also includes a reference capacitor $C_{REF}$ electrically connected to ground (GND) and electrically connected to the DIFF output node. In embodiments, a capacitance of the reference capacitor is equal to a sum of the values of each of the capacitors associated with the least-significant inputs, e.g., A0, B0, of each set of inputs, e.g., A and B. In embodiments, the scaled capacitors e.g., A0 . . . A2 and B0 . . . B2 and the reference capacitor $C_{REF}$ can include capacitor types such as metal-insulator-metal (MIM) capacitors, metal-oxide semiconductor (MOS) capacitors, and deep trench capacitors.

In embodiments, a reset device is electrically connected to GND and to the DIFF output node through an output terminal. The reset device is configured to draw, in response to receiving a RESET signal at an input terminal, the DIFF output node to GND. In some embodiments, the reset device can be, for example, an N-channel field-effect transistor (NFET). During operation of the 3-bit charge-scaling subtractor 100, the RESET signal can be asserted, e.g., to a logic "1" state, following the subtraction of two binary numbers, in order to draw the DIFF output node to GND. Resetting the subtractor 100 by drawing the DIFF output node to GND can be useful in preparing the subtractor 100 to receive a subsequent set of input signals representing binary numbers.

The scaled capacitors depicted in FIG. 1, i.e., A0 . . . A2, B0 . . . B2, and $C_{REF}$ are interconnected and assigned capacitance values, as described above, that are proportional to the significance of each bit of the corresponding inputs. For example, in embodiments, scaled capacitor A0, connected to the A0 input which receives the least significant bit of the binary number A, is assigned a value of $C_{UNIT}$. Scaled capacitor A1 is connected to the A1 input which receives the next most significant bit of the binary number A and is assigned a value of $2*C_{UNIT}$, and scaled capacitor A2, connected to the A2 input which receives the most significant bit of the binary number A and is assigned a value of $4*C_{UNIT}$. The capacitance values of scaled capacitors B0, B1 and B2 are similarly proportioned.

According to embodiments, the binary-weighted ratio of the scaled capacitors, e.g., A0, A1, A2 in a ratio of 1:2:4, in conjunction with the interconnection with reference capacitor $C_{REF}$ allows the 3-bit charge-scaling subtractor 100 to function as a capacitive voltage-divider circuit. During operation of the subtractor 100, a voltage level, e.g., an IC supply voltage $V_{DD}$ or GND, representing a logical "1" or logical "0," respectively, is applied to each bit of the two sets of inputs representing the two binary numbers A and B. As described above, the binary number B is inverted before it is applied to its respective scaling capacitors, while the non-inverted value of binary number A is applied to its respective scaling capacitors. In some embodiments, an IC supply voltage $V_{DD}$ can be within a specified range, for example, between 0.9 V and 1.1 V.

The 3-bit charge-scaling subtractor 100 acts as a capacitive voltage-divider circuit in response to applied voltage levels at the two sets of inputs. The DIFF output is thus drawn to a difference voltage proportional to the binary-weighted difference between the input values A0 . . . A2 and the input values B0 . . . B2, where the difference voltage can be in a range between $-V_{DD}$ and $+V_{DD}$. The difference voltage that is proportional to the binary-weighted difference between the input values is further depicted in FIG. 2 and discussed in the associated text.

In some embodiments, the precision of subtraction operations performed with charge-scaling subtractor such as subtractor 100 may be limited. For example, an 8-bit charge-scaling subtractor may have a reduced or limited precision such that the voltage proportional to a difference between received 8-bit binary numbers is within a range corresponding to +/−1 least significant bit (LSB) of the received 8-bit binary numbers. Such an accuracy limit can result, for example, from factors such as dimensional and repeatability limitations of a particular semiconductor process. Dimensions of semiconductor structures, e.g., scaled capacitors, may vary due to such semiconductor process limitations, which can result in the capacitance value of scaled capacitors deviating from a specified value. Such deviations can cause deviations in difference output voltages from a specified value, which may result in incorrect translation of this voltage level by analog-to-digital converter 106 into a binary number representing the difference.

In certain applications, the functional accuracy of a charge-scaling subtractor may be limited by the resolution of an ADC such as 106. By way of example, for a supply voltage $V_{DD}$ of 1.0 V, a particular ADC may only be able to accurately translate DIFF output voltage steps of 4 mV or greater into binary numbers. In some cases, the accuracy of such an ADC may alternately be limited by a number of steps or divisions of the example supply voltage $V_{DD}$ of 1.0 V. For example, such an ADC may only be able to resolve 250 or fewer divisions of the example $V_{DD}$ of 1.0 V. In some embodiments, a smallest voltage increment of the voltage proportional to a difference between received N-bit binary numbers can be greater than an operating voltage of an ADC divided by 250.

Certain computing systems and associated software applications may not require highly accurate mathematical operations and may be able to function successfully while using limited or reduced-precision operations such as subtraction, as can be provided by embodiments. Aspects of the present disclosure can be useful in performing subtraction of binary numbers at a significantly increased speed relative to traditional subtractor circuits and devices. Such increased computational speed can be particularly useful within computing systems and associated software applications requiring a great number of operations to be performed but where high-precision is not required. Such applications can include data-centric tasks such as AI, data mining, cognitive computing solutions and the like, and may be hosted on computing hardware platforms such as HPCs or supercomputers. Embodiments of the present disclosure can be easily integrated into ICs and other data-processing hardware used within such hardware platforms as HPCs or supercomputers.

Embodiments of the present disclosure can also be integrated effectively into computing hardware and systems designed to perform mixed-precision mathematical operations, in which trade-offs are dynamically made by the system between computational speed and computational accuracy. Embodiments can provide such a system with a particularly rapid and energy-efficient alternative to traditional binary computational hardware.

Figure 2:
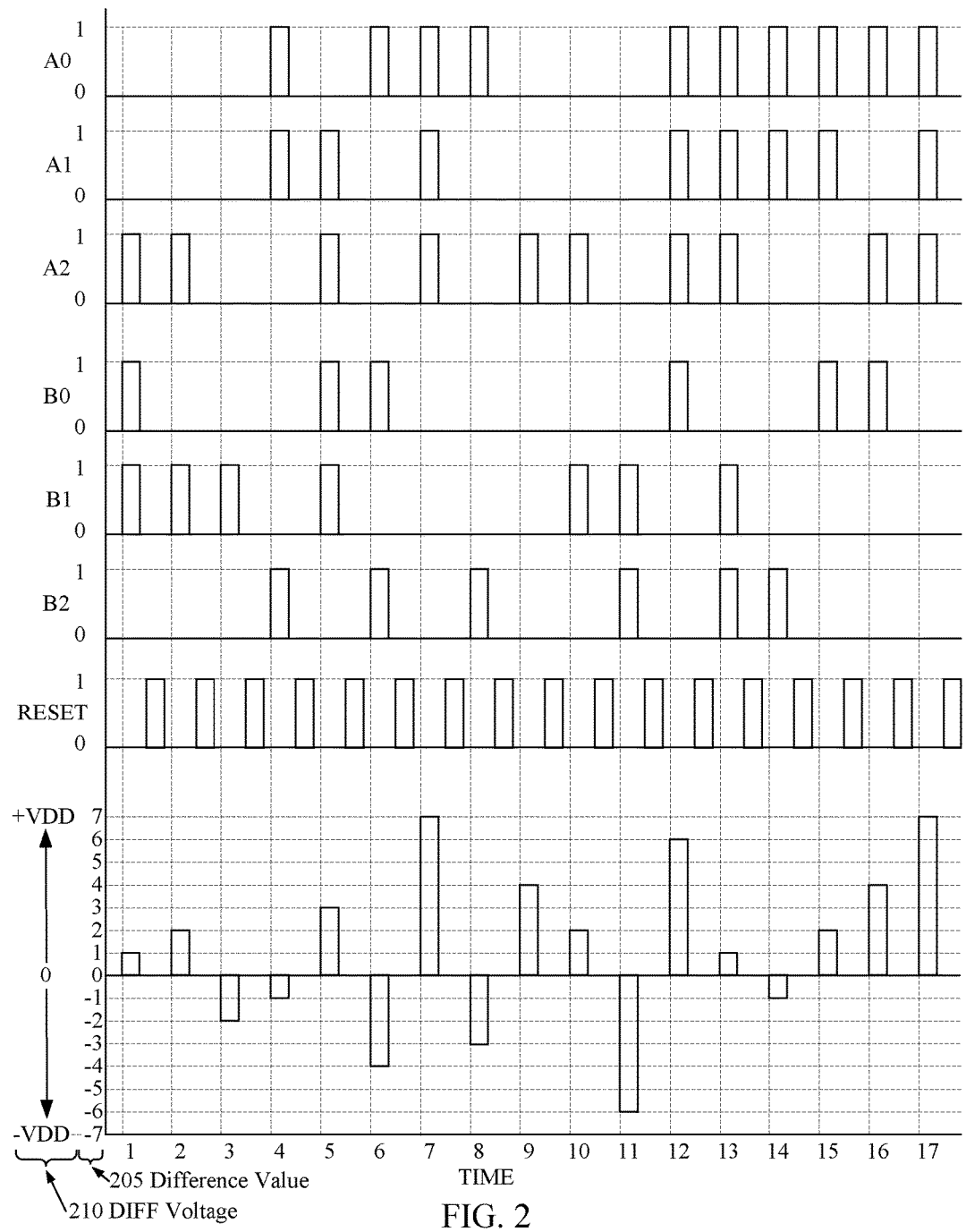
FIG. 2 is a waveform diagram depicting input and output waveforms of a 3-bit charge-scaling subtractor circuit, according to embodiments consistent with the figures.

FIG. 2 is a waveform diagram depicting input and output signal waveforms of the 3-bit charge-scaling subtractor circuit 100 of FIG. 1, according to embodiments consistent with the figures, particularly FIG. 1. The input and output signal waveforms provided in FIG. 2 can provide a visual understanding of causal relationships between logical values of the input signals, i.e., A0 . . . A2, B0 . . . B2 and RESET, and the DIFF node voltage 210 and the difference values 205 of the DIFF output signal. For example, FIG. 2 depicts several sets of binary number inputs, i.e., the values corresponding to the A0 . . . A2 and B0 . . . B2 inputs, and the resulting difference values 205 and DIFF node voltage 210.

FIG. 2 can also provide an illustration of the relative speed and efficiency of a charge-scaling subtractor circuit, e.g., 100, FIG. 1, relative to various types of binary subtractor circuits. Binary subtractor circuits such as half subtractors, full subtractors, ripple-borrow subtractors and borrow-lookahead subtractors can, depending on architecture, complexity, and the number of bits in the minuend and subtrahend, can require several logic clock cycles to complete a subtraction operation. Propagation of signals representing carry bits can contribute significantly to the delay of such subtractors. As depicted in FIG. 2, the subtraction of two binary numbers using the charge-scaling subtractor circuit 100 of FIG. 1 is completed directly following the application of the two binary numbers, which can amount to a significant time savings with respect to other types of binary subtractor circuits. It is contemplated that particular embodiments of the present disclosure may complete binary number subtractions approximately 5× faster than comparable binary subtractor circuits.

The vertical axis of FIG. 2 includes labels corresponding to charge-scaling subtractor input and output signals. Progressing from the top of the vertical axis downwards, labels appear for each of the input signals A0, A1, A2, B0, B1, B2 and RESET, along with corresponding labels for logical "0" and logical "1" states for each input signal. In accordance with voltages used to represent logic states within an integrated circuit, it can be understood that an input signal logical "1" state corresponds to an input voltage equivalent to an IC supply voltage, e.g., $V_{DD}$. Similarly, it can be understood that an input signal logical "0" state corresponds to an input voltage equal to 0.0 V or GND.

Below the input signal labels are labels for the DIFF node voltage 210, ranging from $-V_{DD}$ to $+V_{DD}$, and for corresponding difference values 205 ranging from −7 to 7. Difference values 205 correspond to the difference between the values of the two binary number inputs at particular points in time. Difference values 205 each proportionally correspond to a DIFF voltage 210 that ranges between $-V_{DD}$ and $+V_{DD}$. For example, the DIFF node output value of +7 corresponds to a DIFF voltage 210 approaching or adjacent to +$V_{DD}$, while the DIFF node output value of −7 corresponds to a DIFF voltage 210 of −$V_{DD}$. According to embodiments, offsets in the DIFF voltage 210 between each two adjacent difference values 205 are uniform. For example, if the DIFF voltage 210 offset between difference values 205 of 0 and 1 is 63 mV, then the DIFF voltage 210 offset between difference values 205 of 1 and 2 is also 63 mV. The voltage offsets between adjacent difference values 205 may vary slightly due to effects of various IC process parameters variations such as scaling capacitor size differences and dimensional tolerances.

The horizontal axis at the bottom of FIG. 2 corresponds to a unitless sequence of times at which sets of input signals representing binary numbers are applied to the A0 . . . A2 and B0 . . . B2 inputs of the charge-scaling subtractor. In some embodiments, the time interval between each labeled unitless time can be, for example, approximately 10 ps, in accordance with circuitry delays and performance characteristics of a particular IC technology.

Following the application of each of these sequential sets of binary number input signals, the RESET signal is actively asserted to a logic "1" in order to reset the charge-scaling subtractor circuit in preparation for the next set of binary number input signals. The assertion of the RESET signal, in conjunction with the return of each of the A0 . . . A2 and B0 . . . B2 input signals to a logic "0" state, or 0 V, is useful to draw each terminal of the scaled capacitors A0 . . . A2 and B0 . . . B2, FIG. 1, of the 3-bit charge-scaling subtractor 100, FIG. 1, to 0 V to prepare the subtractor to receive and evaluate a subsequent set of binary number inputs.

At time 1, for example, binary number values of 4 and 3 are applied to the A0 . . . A2 and B0 . . . B2 inputs, respectively, and in response, the difference value 205 transitions to the value of 1, representing the difference between the binary numbers, i.e., the value of A minus the value of B. The inputs then return to a logic "0" state, and the RESET signal is subsequently asserted, resulting in the subtractor being reset and the difference value 205 transitioning to a value of 0. At time 2, binary number values of 4 and 2 are applied to the A0 . . . A2 and B0 . . . B2 inputs, respectively, and in response, the difference value 205 transitions to a value of 2. The RESET signal is again asserted, resulting in the subtractor being reset and the difference value 205 transitioning to the value of 0. This alternating sequence of subtracting two binary numbers and subsequently resetting the subtractor circuit continues through time 17. As depicted, the difference value 205 can, depending on the values of A and B at particular points in time, have a positive value, a negative value or can be 0.

Figure 3:
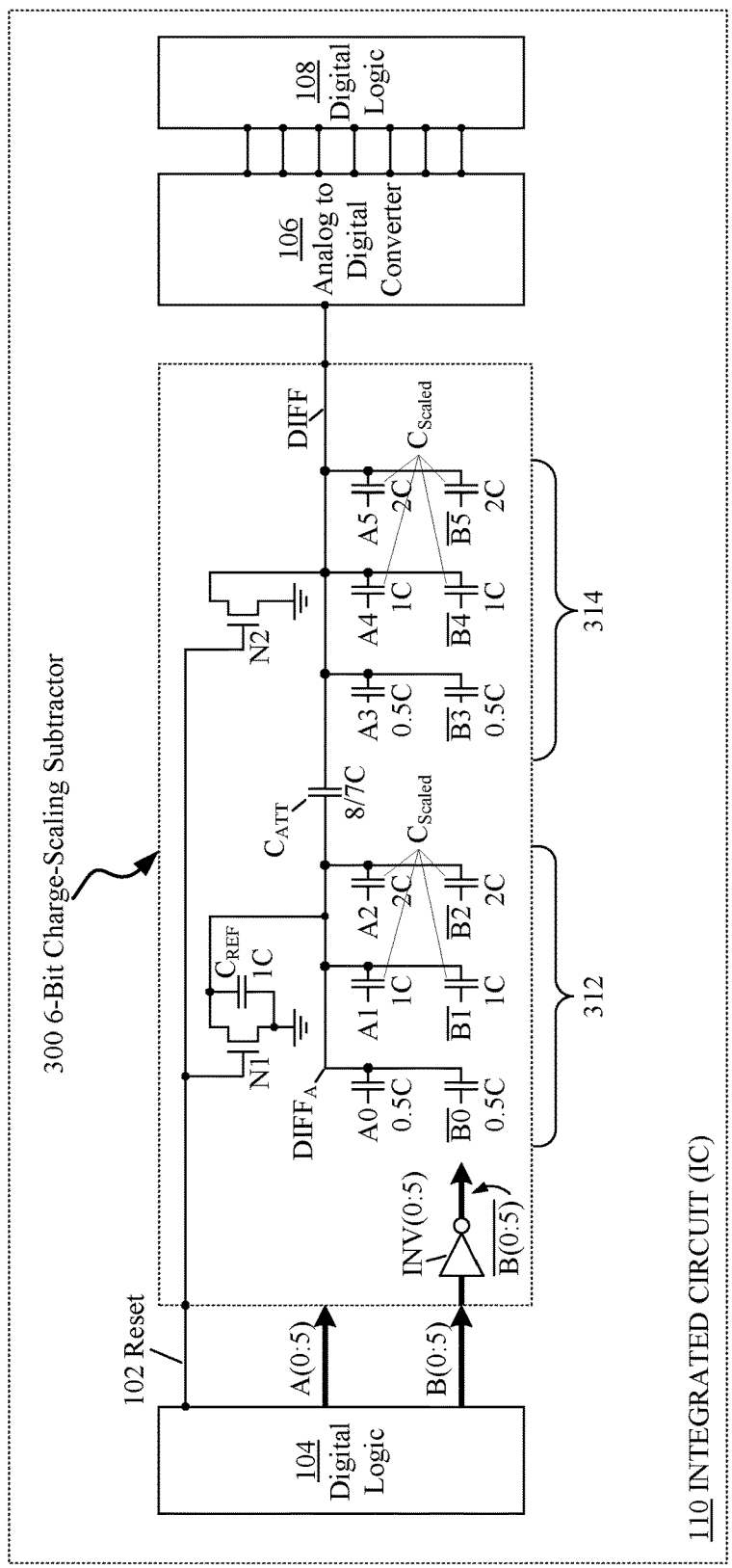
FIG. 3 includes a schematic depiction of a 6-bit charge-scaling subtractor circuit within an IC, according to embodiments consistent with the figures.

FIG. 3 includes a schematic depiction of a 6-bit charge-scaling subtractor circuit 300 fabricated within an IC 110, according to embodiments generally consistent with the figures, particularly FIG. 1. Consistent with the charge-scaling subtractor circuit configuration depicted in FIG. 1, IC 110 can also include the digital logic 104, analog-to-digital converter 106 and digital logic 108 circuits. These circuits can each be interconnected to interact with charge-scaling subtractor 300 in a manner similar to interconnections and interactions with charge-scaling subtractor 100, FIG. 1. For example, 6-bit charge-scaling subtractor 300 can receive binary numbers A and B, and a RESET signal from digital logic 104, which can alternately supply an interleaved sequence of binary numbers A and B, and RESET signals to the subtractor 300. According to embodiments, the input signals, including A, B and RESET, and the output DIFF signal have consistent signaling levels, timing and protocol to those of subtractor circuit 100. The input and output waveforms of 6-bit charge-scaling subtractor circuit 300 are likewise similar and consistent to the input and output waveforms of subtractor circuit 100 depicted in FIG. 2. The charge-scaling subtractor circuit 300 can be useful in providing rapid subtraction of received binary numbers for various types of ICs that are fabricated with a wide variety of IC technologies and associated design methodologies.

FIG. 3 illustrates a charge-scaling subtractor 300 configured to receive two 6-bit binary numbers A and B and output a voltage that is an analog of the difference between these binary numbers, which when re-converted to binary by ADC 106, includes 7 bits. However, this is not to be construed as limiting. It can be understood that, according to embodiments, the binary numbers input to such a subtractor can include a different number of bits, e.g., 5, 7, 8, etc., and that the corresponding difference output can include a number of bits sufficient to represent the difference between the two binary input numbers.

Charge-scaling subtractor 300 includes two sets of "N" inputs, i.e., A(0:5) and B(0:5), where N=6, configured to receive 6-bit binary numbers A and B, respectively. Indexing of the A and B inputs is consistent with indexing of similar A and B inputs of 3-bit charge-scaling subtractor 100, FIG. 1.

In embodiments, subtractor 300 also includes scaled capacitors, $C_{SCALED}$. The A and B inputs A(0:5) and B(0:5), respectively are each associated with a corresponding set of the $C_{SCALED}$ capacitors. The set of scaled capacitors A0 . . . A5, corresponding to the A input, each has one input terminal electrically connected to a respective $n^{th}$ A input and an output terminal electrically connected to its respective local difference node, i.e., $DIFF_A$ and DIFF. According to embodiments, difference nodes $DIFF_A$ and DIFF of electrically adjacent sections 312 and 314 are each connected to a respective terminal of attenuation capacitor $C_{ATT}$. In some embodiments, the subtractor 300 can include, for example, three or more sections similar to sections 312 and 314 and two or more attenuation capacitors similar to $C_{ATT}$.

Each of the B inputs, i.e., B0 . . . B5, is connected to an input terminal of a respective inverter from of a set of inverters INV(0:5). Each of the inverters INV(0:5) has an output terminal connected to an input terminal of a corresponding $n^{th}$ scaled capacitor, i.e., B0 . . . B5. The inverters INV(0:5) drive the inverted copies of B0 . . . B5, i.e., B0 NOT . . . B5 NOT, to the input terminals of scaled capacitors B0 . . . B5, respectively. The set of scaled capacitors B0 . . . B5 each has an output terminal electrically connected to its respective local difference node, i.e., $DIFF_A$ and DIFF.

In embodiments, driving the signals B0 NOT . . . B5 NOT to the input terminals of scaled capacitors B0 . . . B5, respectively, can be useful for providing a voltage excursion for asserted B NOT signals that is complimentary to the corresponding voltage excursion of asserted A inputs. This complimentary voltage excursion is useful, in conjunction with the capacitive voltage divider topology of the interconnected $C_{SCALED}$, $C_{REF}$ and $C_{ATT}$ capacitors, in providing a DIFF output voltage that represents the difference of the values of the two binary inputs, i.e., A minus B.

According to embodiments, the 6-bit charge-scaling subtractor 300 is divided into two sections 312 and 314, each section including a local difference node, i.e., $DIFF_A$ and DIFF, respectively. Each section 312 and 314 also includes scaled capacitors from the sets A(0:5) and B(0:5), respectively. For example, section 312 includes scaled capacitors A(0:2) and B(0:2), and section 314 includes scaled capacitors A(3:5) and B(3:5). In embodiments, section 312 can be understood to be the least significant (LS) section, as it corresponds to the least significant inputs, i.e., 0:2 of the A and B inputs A(0:5) and B(0:5). Similarly, section 314 can be understood to be the most significant (MS) section, as it corresponds to the most significant inputs, i.e., 3:5 of the A and B inputs A(0:5) and B(0:5).

In embodiments, each scaled capacitor within a particular section has a scaled capacitance value that is equal to $2^{(n-L)} * C_{UNIT}$, where n is the index of the scaled capacitor, and L corresponds to the index of the least significant scaled capacitor in the particular section. For example section 312 includes capacitors A0, A1, and A2, so the index "L" of the least significant scaled capacitor in this section is "0," resulting in the capacitance values of the A0, A1, and A2 capacitors being $2^{(0)}$, $2^{(1)}$ and $2^{(2)}$, or 1, 2, and 4 times $C_{UNIT}$, respectively. Similarly, section 314 includes capacitors A3, A4, and A5, so the index "L" of the least significant scaled capacitor in this section is "3," resulting in the capacitance values of the A3, A4, and A5 capacitors also being $2^{(0)}$, $2^{(1)}$ and $2^{(2)}$, or 1, 2, and 4 times $C_{UNIT}$, respectively. In embodiments, the unit capacitance $C_{UNIT}$ is equivalent to the capacitance value of the scaled capacitor connected to the least significant bit, e.g., A0 or B0 of the sets of "N" inputs A and B. For 6-bit charge-scaling subtractor 300, $C_{UNIT}$ is equal to 0.5*C. Each scaled capacitor associated with the set of B inputs is similarly scaled and indexed.

According to embodiments, 6-bit charge-scaling subtractor 300 also includes a reference capacitor $C_{REF}$ electrically connected to GND and to a local difference node within LS section of the subtractor 300. In embodiments a capacitance value of the reference capacitor is equal to a sum of the values of each of the least-significant capacitors, e.g., A0 and B0, of each set of inputs, e.g., A and B.

The value of the attenuation capacitor, "$C_{ATT}$," between two electrically adjacent sections, e.g., the MS section 314 and the LS section 312, can be defined by the following equation:

$$C_{ATT} = C_{UNIT} * \frac{\sum LS \text{ Section } C}{\sum MS \text{ Section } C}$$

Where:
$C_{ATT}$=attenuation capacitance connected between the $DIFF_A$ node and the DIFF node, in farads (F)
$C_{UNIT}$=the unit capacitance in farads (F)
ΣLS Section C=sum of the scaled capacitances in the LS section in farads (F)
ΣMS Section C=sum of the scaled capacitances in the MS section in farads (F)

According to embodiments, the scaled capacitors are configured to have a binary-weighted capacitance ratio, e.g., A0, A1, A2 are configured to have a capacitance ratio of 0.5:1:2. These ratioed scaled capacitors, in conjunction with the interconnected reference capacitor $C_{REF}$ and the attenuation capacitor $C_{ATT}$, allow the 6-bit charge-scaling subtractor 300 to function as a capacitive voltage-divider circuit. During operation of the subtractor 300, a voltage level, e.g., an IC supply voltage $V_{DD}$ or GND, representing a logical "1" or logical "0," respectively, is applied to each bit of the two sets of inputs representing the two binary numbers A and B. As described above, the binary number B is inverted before it is applied to its respective scaling capacitors, while the non-inverted value of binary number A is applied to its respective scaling capacitors. The 6-bit charge-scaling subtractor 300, in response to applied voltage levels at the two sets of inputs, proportionally divides the voltages applied to the two sets of inputs. The resulting DIFF output is thus drawn to a difference voltage proportional to the binary-weighted difference between the input values A0 . . . A5 and the input values B0 . . . B5. According to embodiments, the difference voltage can be in a range between $-V_{DD}$ and $+V_{DD}$. A difference voltage that is proportional to the binary-weighted difference between the input values is further depicted in FIG. 2 and discussed in the associated text. Interconnecting nodes $DIFF_A$ and DIFF with attenuation capacitor $C_{ATT}$ can be useful in scaling the effect of the inputs of the lesser significant section on the output difference voltage, e.g., DIFF voltage 210, FIG. 2, to be proportionally less significant than the inputs of the more significant section.

The use of attenuation capacitors, e.g., $C_{ATT}$, can also be helpful in managing or reducing the total capacitance requirements for implementing a charge-scaling subtractor circuit design. For example, the inclusion of attenuation capacitors within charge-scaling subtractor 300, in conjunction with limiting the number of scaled capacitors $C_{SCALED}$ in each section, can result in the relatively small ratios, e.g., 1:2, 1:4, between the relative sizes and capacitance values of scaled capacitors in each section of the subtractor 300. In some embodiments, for example the number of scaled capacitors within each section can be limited to five or less. These relatively small capacitance ratios can effectively limit the size of the largest scaled capacitor within a section, and therefore the amount of total capacitance needed to implement a particular charge-scaling subtractor design. Such limitations can result in managed and limited IC circuit area requirements for charge-scaling subtractor designs.

As an example, a 6-bit charge-scaling subtractor, if implemented without attenuation capacitors, could have a range of scaled capacitor sizes from 0.5 C up to 16 C. When combined with a reference capacitor value of 1 C, the total capacitance within such a design would be 64 C. In contrast, the total capacitance of all the scaled capacitors of 6-bit charge-scaling subtractor 300 that employs attenuation capacitors is 16 C.

In embodiments, each of the multiple sections 312 and 314 also includes a local reset device, e.g., N1 and N2, respectively, electrically connected to GND, and to the $DIFF_A$ and DIFF nodes through their respective output terminals. During operation of the 6-bit charge-scaling subtractor 300, the RESET signal can be asserted, e.g., to a logic "1" state, to activate local reset devices N1 and N2, following the subtraction of two binary numbers. The activation of N1 and N2 can draw the local difference node $DIFF_A$ and the DIFF output node to GND. Resetting the subtractor 300 by drawing the DIFF output node and $DIFF_A$ node to GND can be useful in preparing the subtractor 300 to receive a subsequent set of input signals representing binary numbers by drawing both terminals of the attenuation capacitor $C_{ATT}$ to GND. The return of inputs A(0:5) and B(0:5) to GND following the subtraction of a set of numbers can similarly draw the attenuation capacitor input terminals to GND. In some embodiments, the reset devices can be, for example, NFETs, where an NFET input terminal is understood to be the gate of the NFET, and an NFET output terminal is understood to be the drain of the NFET. In such embodiments, the source of the NFET can be connected to GND.

In some embodiments, the precision of subtraction operations performed with charge-scaling subtractor such as subtractor 300 may be limited by factors previously discussed in reference to 3-bit charge-scaling subtractor 100, FIG. 1. In certain applications, the functional accuracy of a charge-scaling subtractor may be limited by the resolution of an ADC such as 106.

Figure 4:
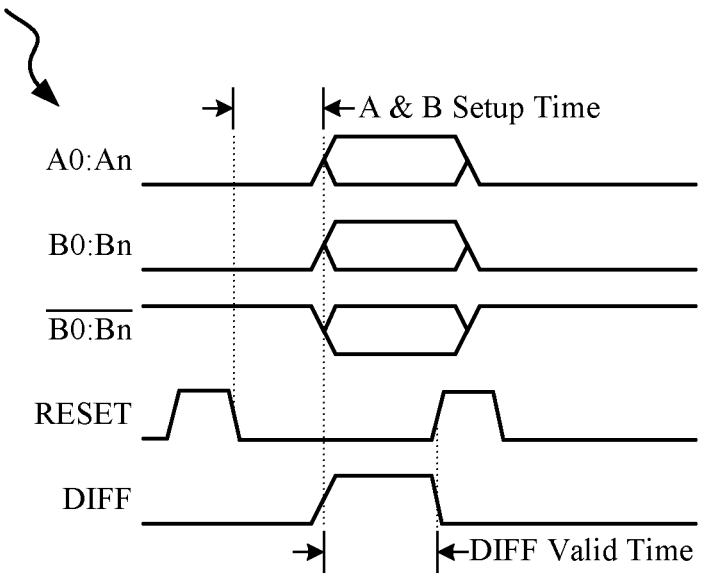
FIG. 4 includes two waveform timing diagrams depicting reset signal and binary number input timing relationships for a charge-scaling subtractor circuit, according to embodiments consistent with the figures.
Figure 4:
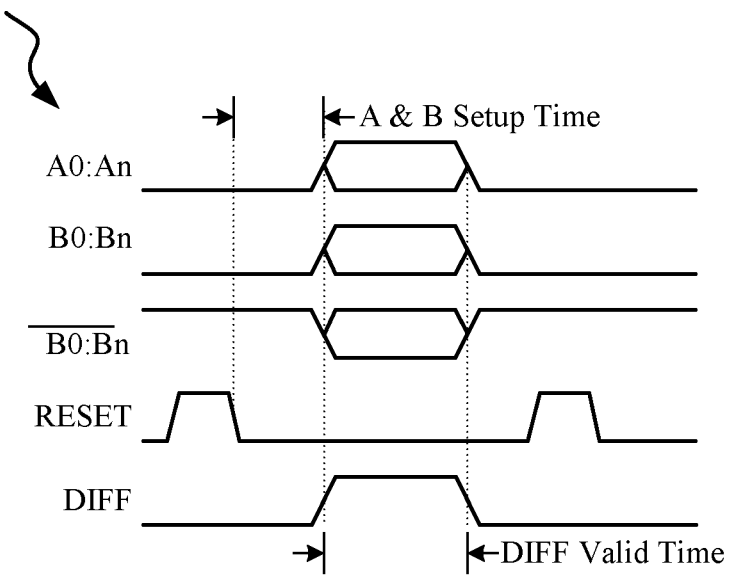

FIG. 4 includes two waveform timing diagrams 400 and 450 that depict possible timing relationships between a RESET signal, binary number input signals, e.g., A0:An and B0:Bn, inverted binary number signals, B0 NOT:Bn NOT and a DIFF output signal of a charge-scaling subtractor circuit, according to embodiments consistent with the figures, particularly FIG. 2. The timing diagrams 400 and 450 provided in FIG. 4 can provide a visual understanding of the effects of RESET signal timing relative to the timing of binary number input signals A0:An and B0:Bn upon the timing and duration of the DIFF output signal. It can be understood that all signals depicted in the waveform drawings appearing in views 400 and 450 are binary in nature, and that the horizontal axis corresponds to time. It can also be understood that the relative timing relationships depicted can apply to charge-scaling subtractors of any size, i.e., number of input bits, and/or configuration.

View 400 depicts a charge-scaling subtractor circuit timing relationship where the RESET signal is asserted to an active state, i.e., a logic "1" value, prior to both sets of binary number inputs, i.e., A0:An and B0:Bn, transitioning to an inactive state, i.e., logic "0" value. This timing relationship can result in a "DIFF valid time" that is governed by the placement of the rising edge of the RESET signal. Such a configuration can produce a DIFF valid time which can be relatively short, which may be useful in certain embodiments where the time allotted for a charge-scaling subtractor circuit to subtract each set of binary numbers, i.e., cycle time, is tightly constrained.

View 450 depicts a charge-scaling subtractor circuit timing relationship where the signal is asserted to an active state, i.e., a logic "1" value, after both sets of binary number inputs, i.e., A0:An and B0:Bn, transition to an inactive state, i.e., logic "0" value. This timing relationship can result in a "DIFF valid time" that is governed by the duration of the active state of binary number input signals. Such a configuration can produce a DIFF valid time which can be relatively long, which may be useful in accommodating an ADC having a particular sample time constraint which cannot be met by a DIFF valid time as depicted in view 400. According to embodiments, the timing relationships depicted in both views 400 and 450 can be used with a variety of charge-scaling subtractor sizes and configurations.

Figure 5:
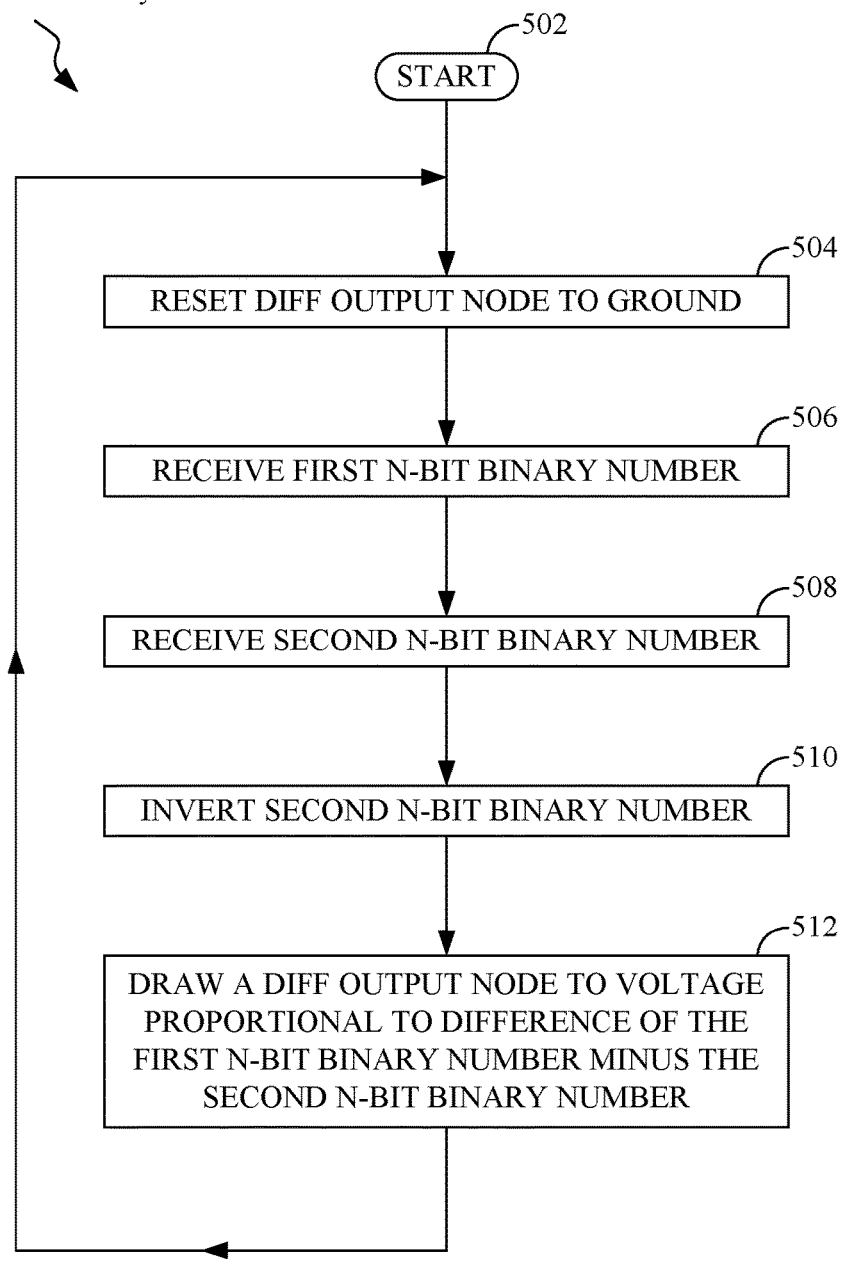
FIG. 5 is a flow diagram depicting a method for operating a charge-scaling subtractor circuit to subtract one binary number from another binary number, according to embodiments consistent with the figures.

FIG. 5 is a flow diagram depicting a method 500 for operating a charge-scaling subtractor circuit, fabricated within IC, to subtract two N-bit binary numbers, according to embodiments consistent with the figures. The use of method 500 can provide, through the use of a charge-scaling subtractor circuit, rapid subtraction of binary numbers. When used with a charge-scaling subtractor fabricated within an IC, method 500 can also provide for substantial increases in computing system throughput through the use of limited-precision or mixed-precision subtraction operations. Such increases in computing system throughput can result in overall increases in computing system performance and benefit to computing system end-users.

The method 500 moves from start 502 to operation 504. Operation 504 generally refers to resetting the charge-scaling subtractor circuit. According to embodiments, the subtractor circuit can be reset by drawing to GND, with a reset device of the subtractor circuit, a DIFF output node. According to embodiments, the reset device can include a transistor such as an NFET which can draw the DIFF output node to GND in response to receiving a RESET signal. According to embodiments, a voltage on the DIFF output node represents the difference between the values of two or more binary numbers received by the subtractor circuit. Drawing the DIFF output node to GND can be useful in creating an initial difference of 0, prior to the charge-scaling subtractor circuit receiving a set of two or more binary numbers. In embodiments of the charge-scaling subtractor circuit that include one or more sections each having a local difference node, operation 504 can also include drawing, with a set of local reset devices, each of the one or more local difference nodes to GND in response to the subtractor circuit receiving the RESET signal. Once the subtractor circuit is reset, the method 500 moves to operation 506.

Operation 506 generally refers to the subtractor circuit receiving a first N-bit binary number. According to embodiments, the first N-bit binary number is received at a first set of N inputs of the subtractor circuit. In embodiments, a section of digital logic, e.g., 104, FIG. 1, within the IC 110, can be electrically connected to the subtractor circuit and configured to provide the first N-bit binary number to the subtractor circuit. Once the first N-bit binary number has been received, the method 500 moves to operation 508.

Operation 508 generally refers to the subtractor circuit receiving a second N-bit binary number. According to embodiments, the second N-bit binary number can be received at the same time as the first N-bit binary number or at a time different from when the first N-bit binary number is received. According to embodiments, the second N-bit binary number is received at a first set of N inputs of the subtractor circuit. In embodiments, a section of digital logic, e.g., 104, FIG. 1, within the IC 110, can be electrically connected to the subtractor circuit and configured to provide the second N-bit binary number to the subtractor circuit. Once the second N-bit binary number has been received, the method 500 moves to operation 510.

Operation 510 generally refers to inverting the second N-bit binary number. According to embodiments, the second N-bit binary number can be inverted with a set of inverters, e.g., INV(0:2), FIG. 1, of the subtractor circuit. Inverting includes driving, onto a set of inverter outputs connected to terminals of the second set of scaled capacitors, the value of the inverted second N-bit binary number. Driving an inverted value of the second N-bit binary number can be useful, in conjunction with the capacitive voltage divider circuit of a charge-sharing subtractor, e.g., 100, FIG. 1, in causing the DIFF output of such a circuit to represent the difference of the second N-bit binary number minus the first N-bit binary number. Once the second N-bit binary number has been inverted, the method 500 moves to operation 512.

Operation 512 generally refers to drawing the DIFF output node of the subtractor circuit to a voltage proportional to a difference between the first and the second N-bit binary numbers. According to embodiments, the first and the second set of scaled capacitors of the subtractor circuit are electrically connected to the first sets of N inputs and the outputs of the set of inverters, respectively, and are used to draw the DIFF output node of the subtractor circuit to the voltage proportional to a difference between the numbers. The use of scaled capacitors having a capacitance value proportional to the significance of a respective bit of the first and the second N-bit binary numbers can be useful in elevating a voltage of the DIFF output node by an amount proportional to the significance of the respective bit. In some embodiments, drawing the DIFF output node of the subtractor circuit to the voltage proportional to the difference between the first and second N-bit binary numbers can be followed by converting, with an ADC within the IC, the voltage to a binary number representing the difference between the first and second N-bit binary numbers. Once the DIFF output node is drawn to a voltage proportional to a difference between the N-bit binary numbers, the method 500 returns to operation 504.

Figure 6:
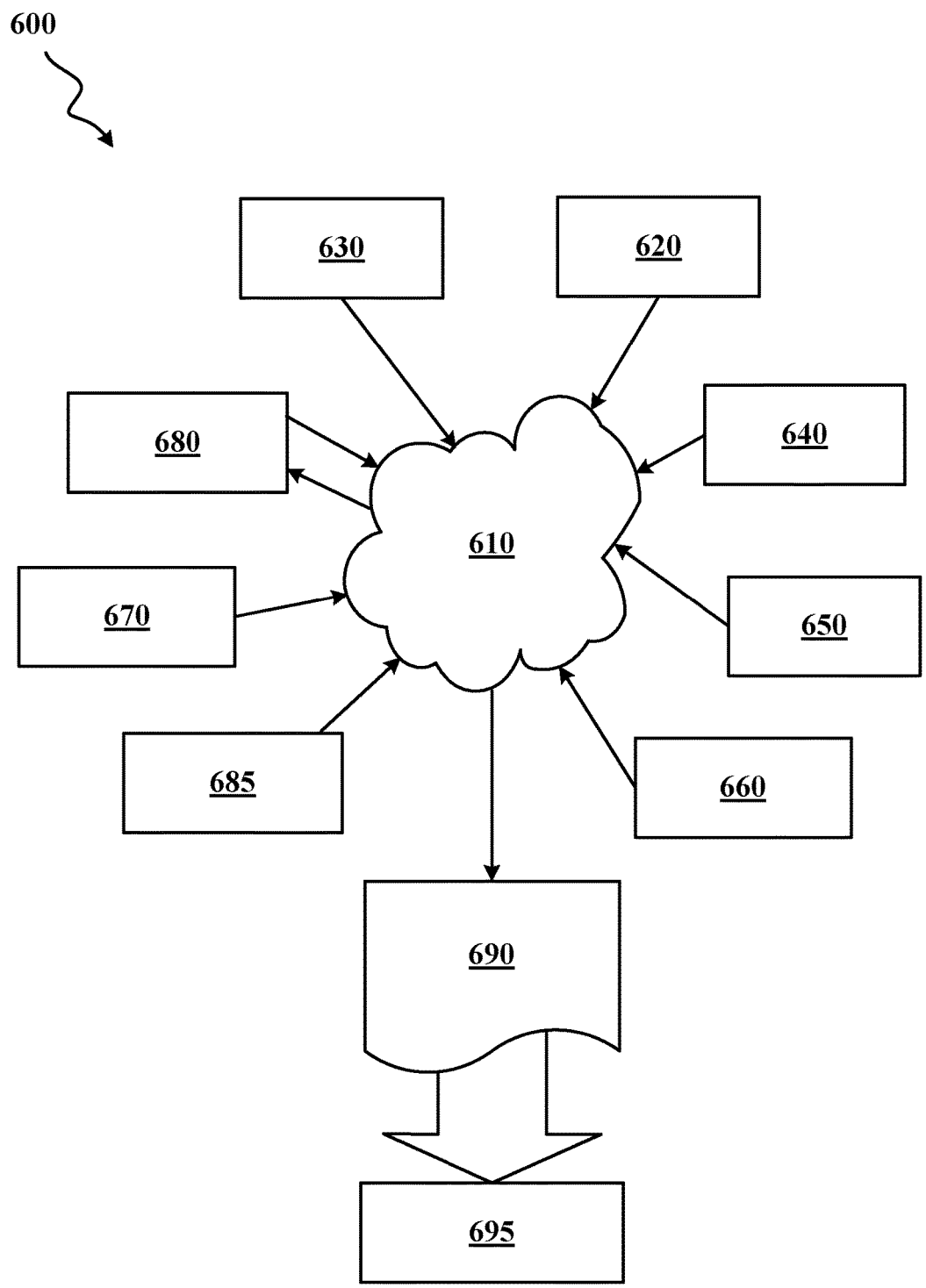
FIG. 6 illustrates multiple design structures including an input design structure that is preferably processed by a design process, according to embodiments consistent with the figures.

FIG. 6 depicts multiple design structures 600 including an input design structure 620 that is preferably processed by a design process, according to embodiments consistent with the figures. Design structure 620 may be a logical simulation design structure generated and processed by design process 610 to produce a logically equivalent functional representation of a hardware device. Design structure 620 may alternatively include data or program instructions that, when processed by design process 610, generate a functional representation of the physical structure of a hardware device. Whether representing functional or structural design features, design structure 620 may be generated using electronic computer-aided design, such as that implemented by a core developer/designer. When encoded on a machine-readable or computer-readable data transmission, gate array, or storage medium, design structure 620 may be accessed and processed by one or more hardware or software modules within design process 610 to simulate or otherwise functionally represent an electronic component, circuit, electronic or logic module, apparatus, device, or system such as those depicted in FIG. 1 and FIG. 3. As such, design structure 620 may include files or other data structures including human or machine-readable source code, compiled structures, and computer-executable code structures that, when processed by a design or simulation data processing system, functionally simulate or otherwise represent circuits or other levels of hardware logic design. Such data structures may include hardware-description language design entities or other data structures conforming to or compatible with lower-level HDL design languages such as Verilog and VHDL, or higher level design languages such as C or C++.

Design process 610 preferably employs and incorporates hardware or software modules for synthesizing, translating, or otherwise processing a design/simulation functional equivalent of the components, circuits, devices, or logic structures depicted in FIG. 1 and FIG. 3, to generate a Netlist 660 which may contain design structures such as design structure 620. Netlist 660 may comprise, for example, compiled or otherwise processed data structures representing a list of wires, discrete components, logic gates, control circuits, I/O devices, models, etc. that describe the connections to other elements and circuits in an integrated circuit design. Netlist 660 may be synthesized using an iterative process in which Netlist 660 is resynthesized one or more times depending on design specifications and parameters for the device. As with other design structure types described herein, Netlist 660 may be recorded on a machine-readable data storage medium or programmed into a programmable gate array. The medium may be a non-volatile storage medium such as a magnetic or optical disk drive, a programmable gate array, a compact flash, or other flash memory. Additionally, the medium may be a system or cache memory, buffer space, or electrically or optically conductive devices and materials on which data packets may be transmitted and intermediately stored via the internet, or other suitable networking means.

Design process 610 may include hardware and software modules for processing a variety of input data structure types including Netlist 660. Such data structure types may reside, for example, within library elements 630 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 640, characterization data 650, verification data 680, design rules 670, and test data files 685 which may include input test patterns, output test results, and other testing information. Design process 610 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 610, without deviating from the scope and spirit of the disclosure. Design process 610 may also include modules for performing standard circuit design processes such as timing analysis, verification, design rule checking, place and route operations, etc.

Design process 610 employs and incorporates logic and physical design tools such as HDL compilers and simulation model build tools to process design structure 620 together with some or all of the depicted supporting data structures, along with any additional mechanical design or data, to generate a second design structure 690. Design structure 690 resides on a storage medium or programmable gate array in a data format used for the exchange of data of mechanical devices and structures (e.g., information stored on an IGES, D7F, Parasolid 7T, JT, DRG, or any other suitable format for storing or rendering such mechanical design structures). Similar to design structure 620, design structure 690 preferably comprises one or more files, data structures, or other computer-encoded data or instructions that reside on transmission or data storage media and that, when processed by an ECAD system, generate a logically or otherwise functionally equivalent form of one or more of the embodiments of the disclosure depicted in FIG. 1 and FIG. 3. In one embodiment, design structure 690 may comprise a compiled, executable HDL simulation model that functionally simulates the devices depicted in FIG. 1 and FIG. 3.

Design structure 690 may also employ a data format used for the exchange of layout data of integrated circuits and/or symbolic data format (e.g., information stored in a GDSII, GL1, OASIS, map files, or any other suitable format for storing such design data structures). Design structure 690 may comprise information such as symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and depicted in FIG. 1 and FIG. 3. Design structure 690 may then proceed to a state 695 where, for example, design structure 690 proceeds to tape-out, is released to manufacturing, is released to a mask house, is sent to another design house, is sent back to the customer, etc.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to explain the principles of the embodiments, the practical application or technical improvement over technologies found in the marketplace, or to enable others of ordinary skill in the art to understand the embodiments disclosed herein.

What is claimed is:

1. A subtractor circuit fabricated within an integrated circuit (IC), the subtractor circuit configured to draw, using charge-scaling circuitry, a difference output node to a voltage proportional to a difference between two received N-bit binary numbers, the subtractor circuit comprising:
a first set of N inputs configured to receive a first binary number having N bits, each input of the first set of N inputs indexed by an integer bit number "n" that corresponds to each input's respective significance, where n is in a range between and including 0 and N−1;
a first set of scaled capacitors, each capacitor of the first set of scaled capacitors having an input terminal electrically connected to a corresponding $n^{th}$ input of the first set of N inputs and an output terminal electrically connected to the difference output node, each capacitor further having a capacitance value equal to $2^{(n)}$*a unit capacitance value ($C_{UNIT}$);
a second set of N inputs configured to receive a second binary number having N bits, each input of the second set of N inputs indexed by the integer bit number "n" that corresponds to each input's respective significance;
a set of inverters, each inverter of the set of inverters having an input terminal electrically connected to a corresponding $n^{th}$ input of the second set of N inputs, each inverter of the set of inverters further having an output terminal electrically connected to an input terminal of a corresponding $n^{th}$ capacitor of a second set of scaled capacitors;
the second set of scaled capacitors, each capacitor of the second set of scaled capacitors having an output terminal electrically connected to the difference output node, each capacitor further having a capacitance value equal to $2^{(n)}$*$C_{UNIT}$;
a reference capacitor electrically connected to ground and electrically connected to the difference output node, a capacitance of the reference capacitor equal to a sum of the values of each of the least significant (LS) scaled capacitors of the first and second sets of scaled capacitors; and
a reset device electrically connected to ground and electrically connected to the difference output node through an output terminal, the reset device configured to draw, in response to receiving a reset signal at an input terminal, the difference output node to ground.

2. The subtractor circuit of claim 1, wherein a voltage of the difference output node is in a range between a negative supply voltage (−Vdd) and a positive supply voltage (+Vdd).

3. The subtractor circuit of claim 1, wherein the reset device is an N-channel field-effect transistor (NFET).

4. The subtractor circuit of claim 1, wherein the IC technology is selected from the group consisting of: complementary metal-oxide semiconductor (CMOS) and silicon on insulator (SOI).

5. The subtractor circuit of claim 1, wherein the subtractor circuit receives binary numbers from digital logic circuits within the IC and outputs an analog voltage representing the difference between the binary numbers to an analog-to-digital converter (ADC) within the IC.

6. The subtractor circuit of claim 5, wherein the ADC is selected from the group consisting of: a flash ADC, a resistor ladder ADC, a parallel comparator ADC, a successive-approximation ADC, and a counter type ADC.

7. The subtractor circuit of claim 1, wherein the scaled capacitors and the reference capacitor are selected from the group consisting of: Metal-Insulator-Metal (MIM) capacitors, metal-oxide semiconductor (MOS) capacitors, and trench capacitors.

8. The subtractor circuit of claim 1, wherein a supply voltage of the subtractor circuit is in a range between 0.9 V and 1.1 V.

9. The subtractor circuit of claim 1, wherein a smallest voltage increment of the voltage, proportional to a difference between received N-bit binary numbers, at the difference output node, is greater than an operating voltage of an analog-to-digital converter (ADC) divided by 250.

10. The subtractor circuit of claim 1, wherein the voltage proportional to a difference between received N-bit binary numbers is within a voltage range corresponding to +/−1 least significant bit (LSB) of the received N-bit binary numbers.

11. The subtractor circuit of claim 1, wherein the unit capacitance value is in a range between 2× and 10× an input capacitance of an ADC connected to the difference output node.

12. A subtractor circuit fabricated within an integrated circuit (IC), the subtractor circuit configured to draw a difference output node to a voltage proportional to a difference between two received N-bit binary numbers, the subtractor circuit comprising:
a plurality of sections including a most significant (MS) section, each section of the plurality of sections having a respective local difference node and a local reset device configured to draw, in response to receiving a reset signal, the respective local difference node to ground, the local difference node of the MS section being the difference output node;
a plurality of attenuation capacitors, each attenuation capacitor of the plurality of attenuation capacitors having first and second terminals electrically interconnected to respective local difference nodes of electrically adjacent sections of the plurality of sections;
a first set of N inputs configured to receive a first binary number having N bits, each input of the first set of N inputs indexed by an integer bit number "n" that corresponds to each input's respective significance, where n is in a range between and including 0 and N−1;
a first set of scaled capacitors including at least one capacitor located within each section of the plurality of sections, the first set of scaled capacitors further including a first MS capacitor located within the MS section, the first MS capacitor having an input terminal electrically connected to an MS input of the first set of N inputs, each capacitor of the first set of scaled capacitors having an input terminal electrically connected to a corresponding $n^{th}$ input of the first set of N inputs, an output terminal electrically connected to a respective local difference node, and a capacitance value equal to $2^{(n)}$*a unit capacitance value ($C_{UNIT}$);
a second set of N inputs configured to receive a second binary number having N bits, each input of the second set of N inputs indexed by the integer bit number "n" that corresponds to each input's respective significance;
a set of inverters, each inverter of the set of inverters having an input terminal electrically connected to a corresponding $n^{th}$ input of the second set of N inputs, each inverter of the set of inverters further having an output terminal electrically connected to an input terminal of a corresponding $n^{th}$ capacitor of a second set of scaled capacitors;

the second set of scaled capacitors including at least one capacitor located within each section of the plurality of sections, the second set of scaled capacitors further including a second MS capacitor located within the MS section, the second MS capacitor having an input terminal electrically connected to an output terminal of an MS inverter of the set of inverters, each capacitor of the second set of scaled capacitors having an input terminal electrically connected to a corresponding output terminal of the $n^{th}$ inverter of the set of inverters, an output terminal electrically connected to a respective local difference node, and a capacitance value equal to $2^{(n)} * C_{UNIT}$; and a reference capacitor electrically connected to ground, and further electrically connected to a local difference node of a least significant (LS) section of the plurality of sections, a reference capacitor value equal to a sum of the values of each of the LS scaled capacitors of the first and second sets of scaled capacitors.

13. The subtractor circuit of claim 12, wherein the plurality of sections includes two sections and the plurality of attenuation capacitors includes one attenuation capacitor.

14. The subtractor circuit of claim 12, wherein the plurality of sections includes three sections and the plurality of attenuation capacitors includes two attenuation capacitors.

15. The subtractor circuit of claim 12, wherein the value of the attenuation capacitor between two electrically adjacent sections is equal to $C_{UNIT}*$(the sum of scaled capacitor values in a less significant section)/(the sum of scaled capacitor values in a more significant section).

16. The subtractor circuit of claim 12, wherein each section corresponds to less than five bits of the received N-bit binary numbers.

17. The subtractor circuit of claim 12, wherein a voltage of the difference output node is in a range between a negative supply voltage (−Vdd) and a positive supply voltage (+Vdd).

18. A method of operating a subtractor circuit that uses charge-scaling to subtract, from a first N-bit binary number, a second N-bit binary number, the subtractor circuit fabricated within an integrated circuit (IC), the method comprising:

resetting the subtractor circuit by drawing to ground, with a reset device of the subtractor circuit, a difference output node of the subtractor circuit;

receiving, with a first set of N inputs of the subtractor circuit, a first N-bit binary number;

receiving, with a second set of N inputs of the subtractor circuit, a second N-bit binary number;

inverting, with a set of inverters of the subtractor circuit, the second N-bit binary number received from the second set of N inputs and driving, onto a set of inverter outputs, the value of the inverted second N-bit binary number; and drawing, with first and second sets of scaled capacitors of the subtractor circuit electrically connected to the first set of N inputs and to the set of inverter outputs, respectively, a difference output node of the subtractor circuit to a voltage proportional to a difference between the first and second N-bit binary numbers.

19. The method of claim 18, further comprising converting to a binary number representing the difference between the first and second N-bit binary numbers, with an analog-to-digital converter (ADC) within the IC, the voltage proportional to the difference between the first and second N-bit binary numbers.

20. The method of claim 18, wherein the resetting further comprises resetting, by drawing to ground with local reset devices of the subtractor circuit, local difference nodes of the plurality of sections of the subtractor circuit.

* * * * *